(12) United States Patent
Park et al.

(10) Patent No.: US 7,713,831 B2
(45) Date of Patent: May 11, 2010

(54) METHOD FOR FABRICATING CAPACITOR IN SEMICONDUCTOR DEVICE

(75) Inventors: Cheol-Hwan Park, Icheon-si (KR); Dong-Su Park, Icheon-si (KR); Eun A. Lee, Seoul (KR); Hye Jin Seo, Suwon-Si (KR)

(73) Assignee: Hynix Semiconductor Inc., Icheon-si (KR)

( * ) Notice: Subject to any disclaimer, the term of this patent is extended or adjusted under 35 U.S.C. 154(b) by 376 days.

(21) Appl. No.: 11/758,507

(22) Filed: Jun. 5, 2007

(65) Prior Publication Data
US 2008/0081430 A1 Apr. 3, 2008

(30) Foreign Application Priority Data
Sep. 29, 2006 (KR) ...................... 10-2006-0095711

(51) Int. Cl.
*H01L 21/20* (2006.01)
(52) U.S. Cl. .................. 438/393; 438/386; 438/239; 438/240
(58) Field of Classification Search .......... 438/239, 438/240, 244, 250, 253, 255, 386, 387, 393, 438/396, 398
See application file for complete search history.

(56) References Cited

U.S. PATENT DOCUMENTS

| | | | |
|---|---|---|---|
| 6,001,742 A | 12/1999 | Chang | ........................ 438/706 |
| 7,362,784 B2 * | 4/2008 | Yamazaki et al. | ..... 257/E21.134 |
| 2003/0129806 A1 * | 7/2003 | Miki et al. | ................... 438/398 |
| 2003/0155621 A1 * | 8/2003 | Moriwaki et al. | ........... 257/412 |
| 2003/0175998 A1 | 9/2003 | Nagano et al. | ................. 438/3 |
| 2004/0235285 A1 | 11/2004 | Kang et al. | ................. 438/597 |
| 2005/0164445 A1 * | 7/2005 | Lin et al. | ..................... 438/240 |
| 2007/0096192 A1 * | 5/2007 | Lee | ........................... 257/310 |
| 2007/0111407 A1 | 5/2007 | Sun | |
| 2007/0128858 A1 * | 6/2007 | Haukka et al. | .............. 438/656 |

FOREIGN PATENT DOCUMENTS

| | | |
|---|---|---|
| CN | 1630042 | 6/2005 |
| KR | 1020020016337 A | 3/2002 |
| KR | 1020040000656 A | 1/2004 |

* cited by examiner

*Primary Examiner*—Kevin M Picardat
(74) *Attorney, Agent, or Firm*—Marshall, Gerstein & Borun LLP

(57) ABSTRACT

A method for forming a capacitor in a semiconductor device is disclosed. The method includes forming a storage node electrode on a semiconductor substrate, forming a dielectric layer having a high dielectric constant on the storage node electrode, depositing a plate electrode on the dielectric layer, thereby forming by-product impurities, and removing by-product impurities remaining on the plate electrode by introducing a hydrogen (H) atom-containing gas onto the semiconductor substrate while depositing a capping layer on the plate electrode.

20 Claims, 6 Drawing Sheets

METHOD FOR FABRICATING CAPACITOR IN SEMICONDUCTOR DEVICE

CROSS-REFERENCE TO RELATED APPLICATION

Priority to Korean patent application number 10-2006-95711, filed on Sep. 29, 2006, the disclosure of which is incorporated by reference in its entirety, is claimed.

BACKGROUND OF THE INVENTION

The invention relates to a semiconductor device. More specifically, the invention relates to a method for forming a capacitor in a semiconductor device capable of exhibiting a high capacitance and a low leakage current.

Recent trends toward highly integrated semiconductor devices have brought about a reduction in cell size thereof. As a result, it is increasingly difficult to form capacitors that have a sufficient capacitance (Cs). In particular, a principal factor in obtaining highly integrated dynamic random access memories (DRAMs) consisting of a transistor and a capacitor is minimizing the area of the capacitor (which occupies a large amount of space in a chip) while maximizing the capacitance of the capacitor. To obtain the capacitance required for each unit cell, there have been actively developed dielectric materials having a high dielectric constant (k). With a decreasing design rule, there has been an increased demand to obtain the required capacitance.

Various methods have been suggested to obtain the desired capacitance. First, a high dielectric material, such as hafnium oxide ($HfO_2$), alumina ($Al_2O_3$), or a multi-layer laminate of these materials is used to form a capacitor dielectric layer. When the high dielectric material is used for the capacitor dielectric layer, atomic layer deposition (ALD), rather than chemical vapor deposition (CVD), is performed based on the large aspect ratio of the capacitor.

Second, there is suggested a structure of metal/insulator/metal (MIM) in which upper and lower electrodes in a capacitor are made of metallic materials having a large work function as a method for imparting superior dielectric performance to the dielectric layer to secure a desired capacitance.

In such a MIM structure, a titanium nitride (TiN) layer is widely used as the electrode material of the capacitor owing to its simple formation process. The titanium nitride (TiN) layer is formed with a mixed gas of titanium tetrachloride ($TiCl_4$) and ammonia ($NH_3$). Chlorine (Cl), generated as a by-product upon the formation of the titanium nitride (TiN) layer, exists in the layer. The residual chlorine (Cl) remaining in the layer causes problems, including a significant increase in specific resistance and thus an increase in contact resistance.

To remove the chlorine (Cl) from the titanium nitride (TiN) layer and improve the qualities of the layer, high-temperature annealing is performed under a nitrogen or ammonia atmosphere after deposition of the titanium nitride layer.

However, in a case where a dielectric layer of the capacitor is made of a material having a high dielectric constant, the dielectric layer has a degraded thermal stability, thus making it incapable of withstanding the thermal stress of subsequent heating processes. That is to say, the dielectric layer undergoes excessive or abnormal crystallization upon the subsequent high-temperature process, thus inducing the formation of a grain boundary. The grain boundary causes an increase in leakage current, thus making it impossible to utilize the dielectric layer in the capacitor. When an electrode is made of titanium nitride, the subsequent heat-treatment cannot be performed under a high temperature. As a result, chlorine (Cl) remains on the electrode, thus causing a deterioration in the conductivity thereof. In addition, chlorine (Cl) accumulates at the interface between the electrode and dielectric layer, and a trap site is formed on the interface therebetween, thereby disadvantageously causing an increase in leakage current of the capacitor.

BRIEF SUMMARY OF THE INVENTION

In an attempt to solve the problems of the prior art, one aspect of the invention provides a method for forming a capacitor in a semiconductor device having an improved electrode conductivity and a higher increase in the capacitance of a capacitor by removing a volatile by-product from the capacitor via an improved capacitor formation process.

In another aspect, the invention provides a method for forming a capacitor in a semiconductor device having a reduced leakage current by preventing the occurrence of an electron trap site inside the capacitor by via removing a volatile by-product from the capacitor.

In accordance with one aspect of the invention, there is provided a method for forming a capacitor in a semiconductor device including: forming a storage node electrode over a semiconductor substrate; forming a dielectric layer having a high dielectric constant on the storage node electrode; depositing a plate electrode on the dielectric layer, thereby forming by-product impurities; and removing the by-product impurities remaining on the plate electrode by introducing a hydrogen (H) atom-containing gas onto the semiconductor substrate while depositing a capping layer on the plate electrode.

The plate electrode may preferably be made of at least one material selected from the group consisting of titanium nitride (TiN), ruthenium (Ru), tungsten nitride (WN), and aluminum nitride (AlN).

The dielectric layer may preferably be made of at least one material selected from the group consisting of hafnium oxide ($HfO_2$), alumina ($Al_2O_3$), zirconium oxide ($ZrO_2$), titanium oxide ($TiO_2$), tantalum oxide ($Ta_2O_5$), barium strontium titanate (BST; $BaSrTiO_3$), and plumbum zirconate titanate (PZT; PbZrTiO).

The formation of the plate electrode may preferably be carried out by high step coverage (HSC), sequence flow deposition (SFD), or atomic layer deposition (ALD).

Preferably, the step of removing the by-product impurities includes: loading the semiconductor substrate into a furnace at a low pressure; introducing a hydrogen (H) atom-containing gas into the furnace; and annealing the semiconductor substrate at a temperature of 400° C. to 600° C.

The capping layer may preferably include a polysilicon layer or a silicon germanium (SiGe) layer.

The hydrogen (H) atom-containing gas may preferably include at least one gas selected from phosphine ($PH_3$) and hydrogen ($H_2$).

Preferably, the step of introducing the hydrogen (H) atom-containing gas onto the semiconductor substrate includes introducing the hydrogen (H) atom-containing gas into the furnace in situ, thereby preventing a reaction between hydrogen (H) and oxygen (O) in air forming titanium oxynitride (TiON).

In accordance with another aspect of the invention, there is provided a method for forming a capacitor in a semiconductor device including: forming a storage node electrode on an interlayer dielectric layer of a semiconductor substrate; forming a dielectric layer having a high dielectric constant on the storage node electrode; supplying a titanium (Ti) source material and a nitride (N) source material to the dielectric layer to deposit a titanium nitride (TiN) layer on the dielectric layer, thereby forming by-product impurities; and removing the by-product impurities remaining on the storage node electrode by introducing a hydrogen (H) atom-containing gas onto the semiconductor substrate while depositing a capping layer on the titanium nitride (TiN) layer.

The step of forming a storage node electrode on an interlayer dielectric layer may preferably include, forming a contact plug in the interlayer dielectric layer; forming a storage node insulating layer over the contact plug and the interlayer dielectric layer; forming a storage node contact hole in the storage node dielectric layer; forming a metallic layer for a storage node on the storage node contact hole; forming the storage node metallic layer adjacent to the contact plug into a metal silicide layer; and node-separating the storage node metallic layer.

The storage node electrode may preferably be made of at least one material selected from the group consisting of titanium nitride (TiN), ruthenium (Ru), tungsten nitride (WN), and aluminum nitride (AlN).

The titanium (Ti) source material may preferably include titanium tetrachloride ($TiCl_4$).

The dielectric layer may preferably be made of at least one material selected from the group consisting of hafnium oxide ($HfO_2$), alumina ($Al_2O_3$), zirconium oxide ($ZrO_2$), titanium oxide ($TiO_2$), tantalum oxide ($Ta_2O_5$), barium strontium titanate (BST; $BaSrTiO_3$), and plumbum zirconate titanate (PZT; $PbZrTiO$).

The formation of the storage node electrode may preferably be carried out by high step coverage (HSC), sequence flow deposition (SFD), or atomic layer deposition (ALD).

The step of removing the by-product impurities may preferably include: loading the semiconductor substrate into a furnace at a low pressure; introducing a hydrogen (H) atom-containing gas into the furnace; and annealing the semiconductor substrate at a temperature of 400° C. to 600° C.

The capping layer may preferably include a polysilicon layer or a silicon germanium (SiGe) layer.

The hydrogen (H) atom-containing gas may preferably include at least one gas selected from phosphine ($PH_3$) and hydrogen ($H_2$).

The step of introducing the hydrogen (H) atom-containing gas onto the semiconductor substrate preferably includes introducing the hydrogen (H) atom-containing gas into the furnace in situ, thereby preventing a reaction between hydrogen (H) and oxygen (O) in airforming titanium oxynitride (TiON).

BRIEF DESCRIPTION OF THE DRAWINGS

The above and other aspects, features, and advantages of the invention will be more clearly understood from the following detailed description taken in conjunction with the accompanying drawings, in which.

DETAILED DESCRIPTION OF THE INVENTION

Preferred embodiments of the invention are described in detail with reference to the accompanying drawings. Those skilled in the art will appreciate that various modifications, additions, and substitutions are possible, without departing from the scope and spirit of the invention as defined in the accompanying claims. In the drawings, the thickness of each element is enlarged for clarity. Throughout the disclosure, the same or similar elements are denoted by the same reference numerals.

FIGS. 1 to 11 are cross-sectional views illustrating a method for forming a capacitor in a semiconductor device according to one embodiment of the invention.

Figure 1:
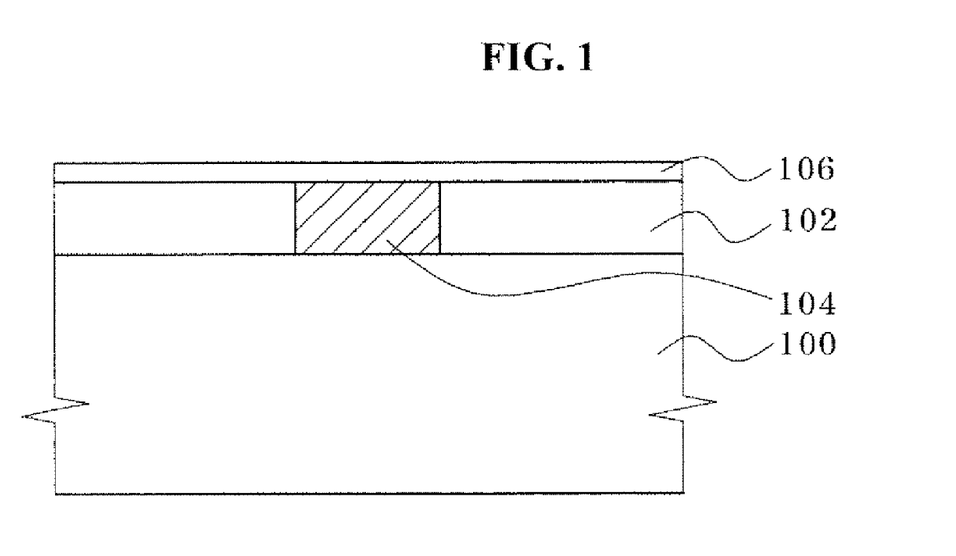
FIGS. 1 to 11 are cross-sectional views illustrating a method for forming a capacitor in a semiconductor device according to the invention.

Referring to FIG. 1, an interlayer dielectric layer 102 is formed over a semiconductor substrate 100 where an underlying structure (not shown) including a transistor and a bit line is arranged. A contact hole (not shown) is formed on the interlayer dielectric layer 102 such that a predetermined region of the surface of the semiconductor substrate 100 is exposed. After being filled with a conductive material, the contact hole is subjected to planarization to form a contact plug 104 connecting the underlying structure to a capacitor to be formed in the following process. Subsequently, a silicon nitride ($Si_3N_4$) layer 106 is formed on the contact plug 104. The silicon nitride ($Si_3N_4$) layer 106 serves as an etching stopping layer upon a formation of a contact hole for a lower electrode. The silicon nitride ($Si_3N_4$) layer 106 is formed by chemical vapor deposition (CVD).

Figure 2:
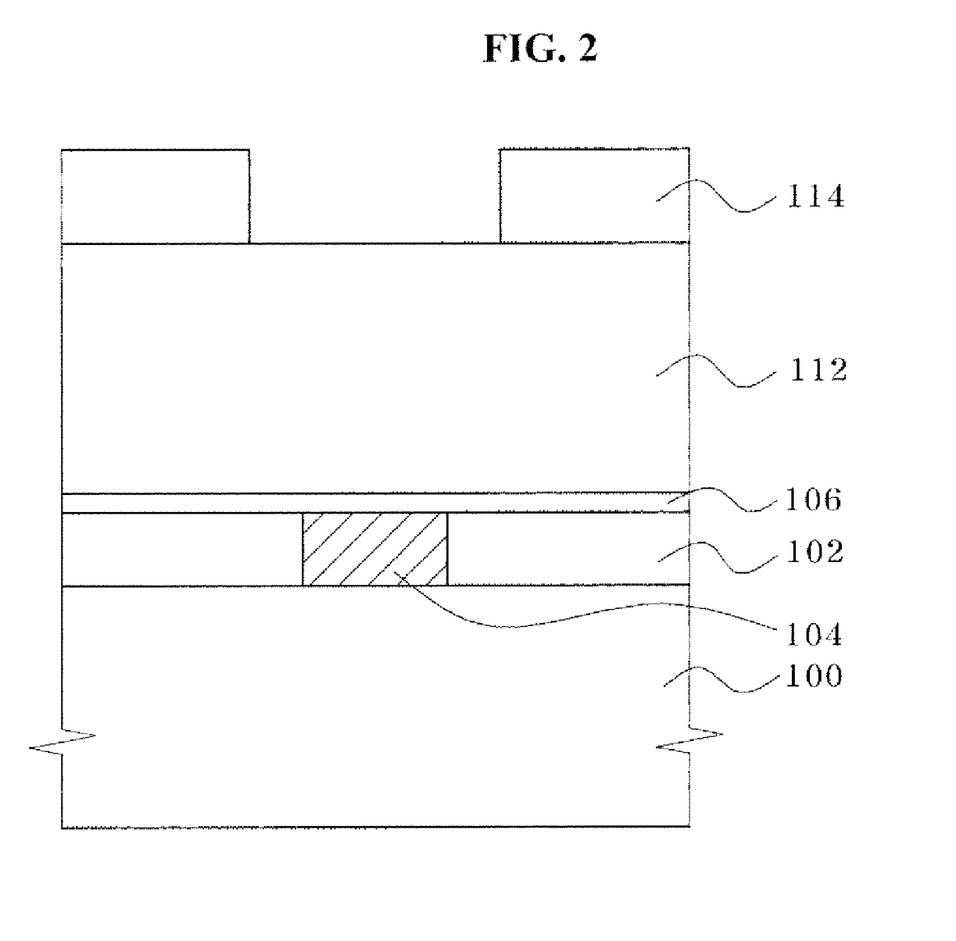

Referring to FIG. 2, a storage node insulating layer 112 is deposited to a thickness corresponding to the desired height of the capacitor on the silicon nitride ($Si_3N_4$) layer 106. The storage node insulating layer 112 is formed by CVD. The storage node insulating layer 112 may be a single layer of a plasma enhanced tetra ethylorthosilicate (PETEOS) oxide layer, or a double-layer of a phosphosilicate glass (PSG) layer and tetraethylorthosilicate (TEOS) oxide layer.

Then, a hard mask layer (not shown) is applied to the storage node insulating layer 112 and then patterned, thereby forming a hard mask layer pattern 114 such that a predetermined region of the storage node insulating layer 112 is exposed. The hard mask pattern 114 is formed of a polysilicon layer.

Figure 3:
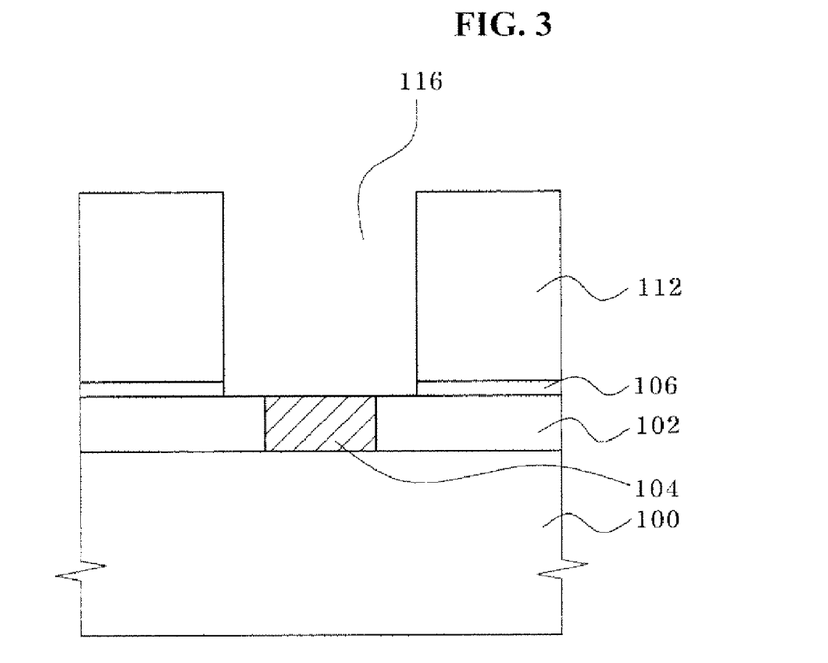

Referring to FIG. 3, the storage node insulating layer 112 is etched using the hard mask pattern 114 as a mask to remove the storage node insulating layer 112 to a predetermined thickness, i.e., a thickness sufficient to expose the silicon nitride layer 106, thereby forming a storage node contact hole 116. Subsequently, the exposed region of the silicon nitride layer 106 in the storage node contact hole 116 is removed such that the contact plug 104 is exposed.

Figure 4:
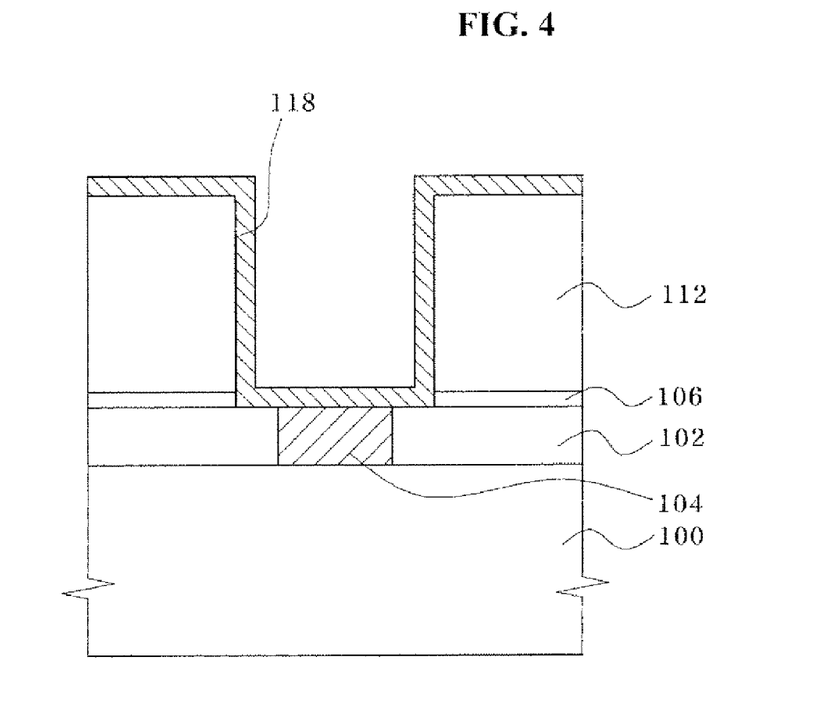

Referring to FIG. 4, a storage node metallic layer 118 is deposited on the storage node insulating layer 112. The storage node metallic layer 118 material is preferably selected from the group consisting of titanium nitride (TiN), tungsten nitride (WN), tantalum nitride (TaN), platinum (Pt), ruthenium (Ru), and amorphous silicon (a-Si). The formation of the storage node metallic layer 118 is preferably carried out by chemical vapor deposition (CVD) including high step coverage (HSC) deposition and sequence flow deposition (SFD). The HSC deposition aims to improve step coverage for capacitors having a large aspect ratio. Alternatively, the storage node metallic layer 118 may be formed by atomic layer deposition (ALD).

The HSC deposition is preferably carried out at a relatively high temperature (e.g., 650° C.). Upon HSC deposition, a titanium nitride (TiN) layer contains a small amount of chlorine (Cl). When $TiCl_4$ is used as a source material in the formation of the storage node metallic layer 118, superior step coverage characteristics can be achieved.

The SFD is applied to reduce thermal stress during high-temperature processes used to deposit the storage node metallic layer 118. In the SFD, a titanium nitride (TiN) layer is preferably formed using $TiCl_4$ as a source material in the formation of the storage node metallic layer 118. Then, the titanium nitride (TiN) layer is preferably subjected to in-situ treatment under an ammonia (NH$_3$) gas atmosphere to reduce the concentration of chlorine (Cl) in the layer. For a low-temperature deposition, the treatment under an ammonia (NH$_3$) gas atmosphere is repeated, thereby minimizing residual chlorine (Cl) in the layer.

Figure 5:
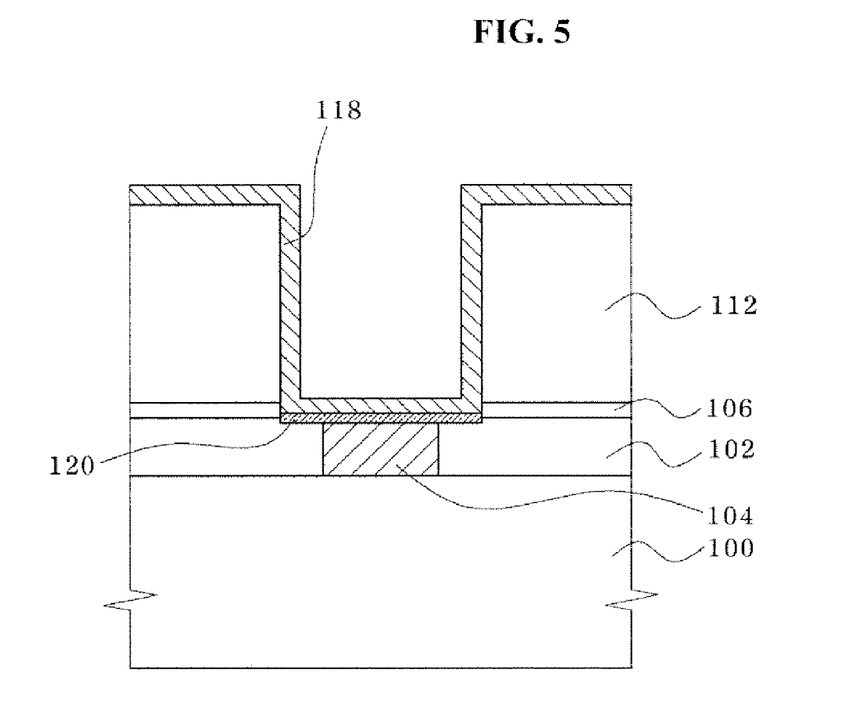

Referring to FIG. 5, a metal silicide layer 120, is formed in an interfacial region where the storage node metallic layer 118 is adjacent to the contact plug 104.

More specifically, the storage node metallic layer 118 material (e.g., titanium nitride (TiN) or titanium (Ti)) arranged on the contact plug 104 is heat-treated. The titanium in the storage node metallic layer 118 reacts with polycrystalline silicon (poly-Si) from the exposed contact plug 104. As a result, the interfacial region node becomes a metal silicide layer 120 (e.g., a titanium silicide (TiSi$_x$ layer). The metal silicide layer 120 reduces toe contact resistance between the contact plug 104 and itself by forming an ohmic contact with a storage node electrode to be formed in a subsequent process.

Figure 6:
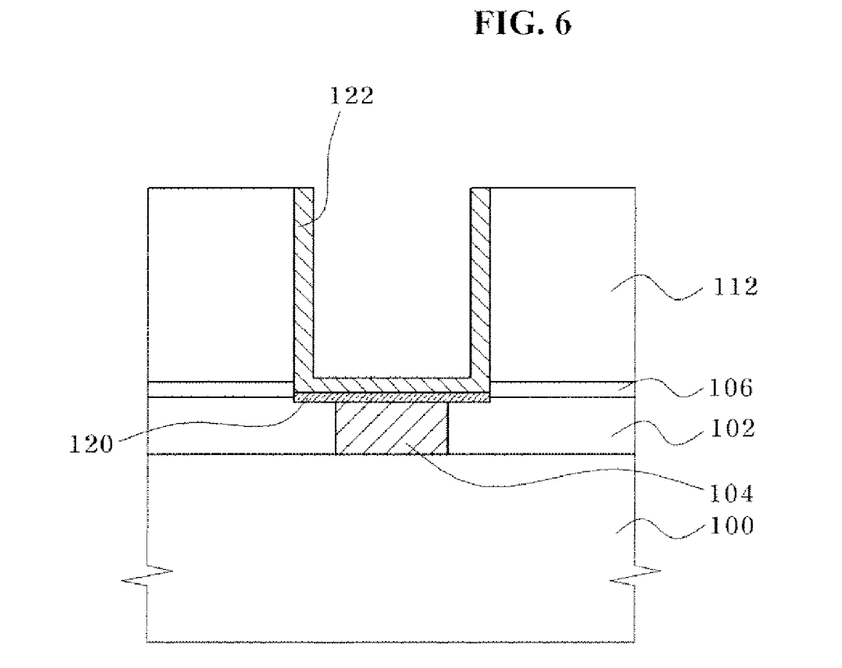

Referring to FIG. 6, an etch-back process is performed on the storage node metallic layer 118 to remove the portion of the storage node metallic layer 118 located on the top surface of the storage node insulating layer 112. As a result, a node-separated storage node electrode 122 is formed in contact with the sidewalls of the storage node insulating layer 112, the interlayer dielectric layer 102, and the contact plug 104, as shown in FIG. 6. Alternatively, the node separation may be carried out by chemical mechanical polishing (CMP).

Figure 7:
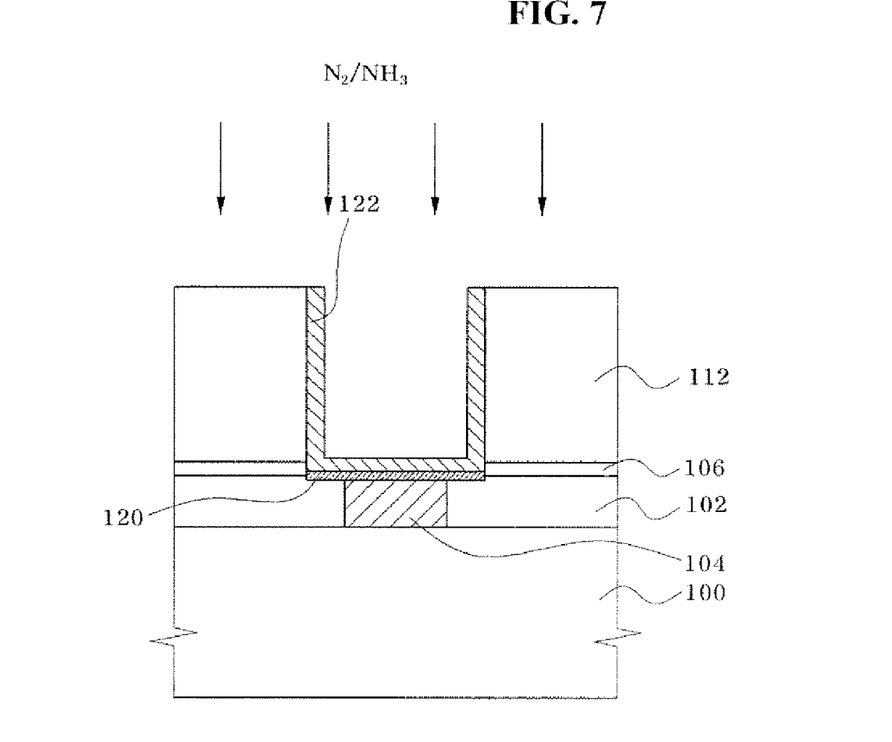

Referring to FIG. 7, the semiconductor substrate 100 is heat treated to remove impurities present in the storage node electrode 122. The heat treatment is preferably carried out under a nitrogen (N$_2$) or an ammonia (NH$_3$) gas atmosphere.

When the storage node electrode 122 is made of a material such as titanium nitride (TiN), the heat treatment induces the discharge (i.e., outgassing) of a volatile by-product (i.e., chlorine (Cl)) generated upon formation of the titanium nitride (TiN) layer, thereby improving the layer qualities of the storage node electrode 122.

Figure 8:
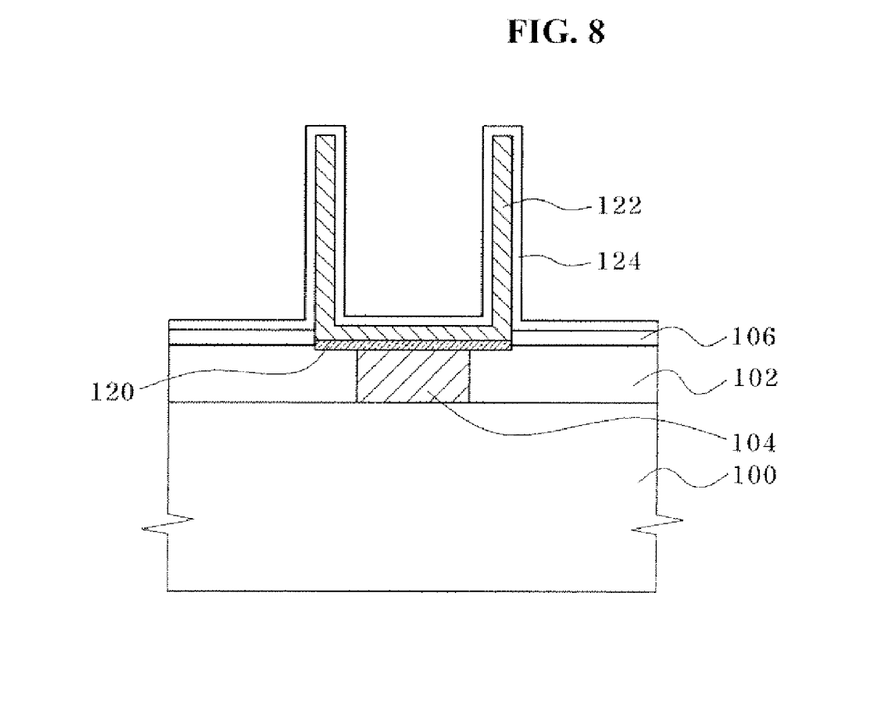

Referring to FIG. 8, the storage node insulating layer 112 is removed to form a cylindrical storage node electrode 122. Then, a dielectric layer 124 is formed on the storage node electrode 122 by atomic layer deposition (ALD). The dielectric layer 124 is made of a high dielectric material such as hafnium oxide (HfO$_2$), alumina (Al$_2$O$_3$); zirconium oxide (ZrO$_2$), titanium oxide (TiO$_2$), and tantalum oxide (Ta$_2$O$_5$). Alternatively, the dielectric layer 124 is made of a ferroelectric material such as barium strontium titanate (BST; BaSrTiO$_3$) and plumbum zirconate titanate (PZT; PbZrTiO). The dielectric layer 124 is formed as a mono-layer or a multi-layer combination of two or more materials.

Figure 9:
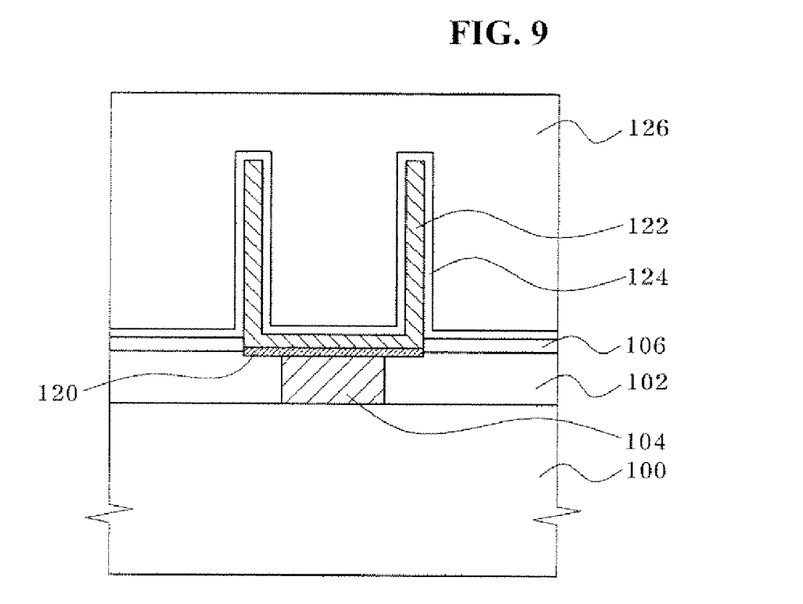

Referring to FIG. 9, a plate electrode 126 is formed on the dielectric layer 124.

The formation of the plate electrode 126 is carried out by chemical vapor deposition (CVD), such as high step coverage (HSC) and sequence flow deposition (SFD), or atomic layer deposition (ALD).

The plate electrode 126 may have a double-layer structure consisting of one titanium nitride (TiN) layer formed by chemical vapor deposition (CVD), and another titanium nitride (TiN) layer formed by a low-stress physical vapor deposition (PVD).

The plate electrode 126 material is preferably at least one selected from the group consisting of titanium nitride (TiN) ruthenium (Ru), tungsten nitride (WN), and aluminum nitride (AlN).

Figure 10:
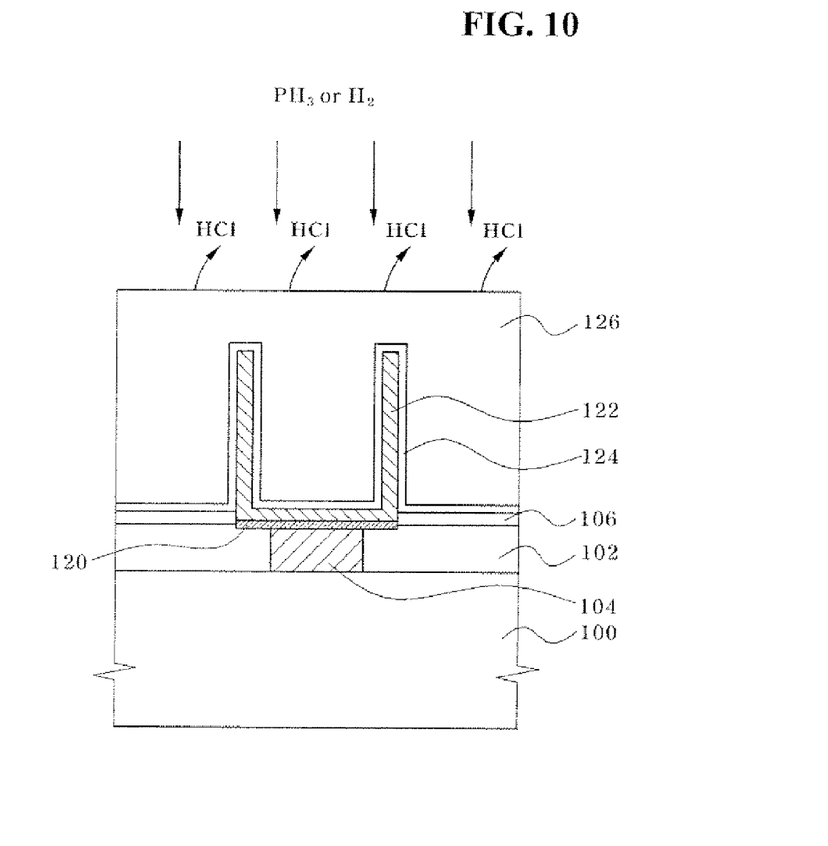

Referring to FIG. 10, the semiconductor substrate 100 is loaded in a furnace to deposit a capping layer 128 (see FIG. 11) on the plate electrode 126. By-product impurities remaining on the plate electrode 126 resulting from the formulation of the plate electrode 126 are removed and discharged from the furnace by introducing a hydrogen (H) atom-containing gas to be reacted with the by-products impurities onto the semiconductor substrate 100 while depositing the capping layer 128. The discharge process is explained in more detail below.

The furnace equipped with the semiconductor substrate 100 is ventilated under a low pressure. A hydrogen (H) atom-containing gas, such as phosphine (PH$_3$) or hydrogen (H$_2$), is introduced through a flow controller into the furnace while the low pressure is maintained. Annealing is preferably performed at a low temperature of 400° C. to 600° C., more preferably at 450° C. to 530° C. At this time, the hydrogen (H) atom-containing gas may be separately introduced into in the furnace. Alternatively, the gas may be a mixture of phosphine (PH$_3$) and a small amount of hydrogen (H$_2$).

When the hydrogen (H) atom-containing gas is supplied to the furnace including the semiconductor substrate 100, the hydrogen (H) atom contained in the gas is easily decomposed and reactive, and it diffuses into the plate electrode 126 formed of a titanium nitride (TiN) layer, etc. As a result, the hydrogen (H) atom reacts with chlorine (Cl) (which is a residual by-product impurity remaining in the titanium nitride (TiN) layer) to form hydrogen chloride (HCl). The HCl derived from the reaction is discharged from the furnace, and is removed from the electrode. As a result, the layer qualities and interface characteristics of the electrode are improved. Thereafter, the desired exhaust and purge processes are carried out in-situ.

Figure 11:
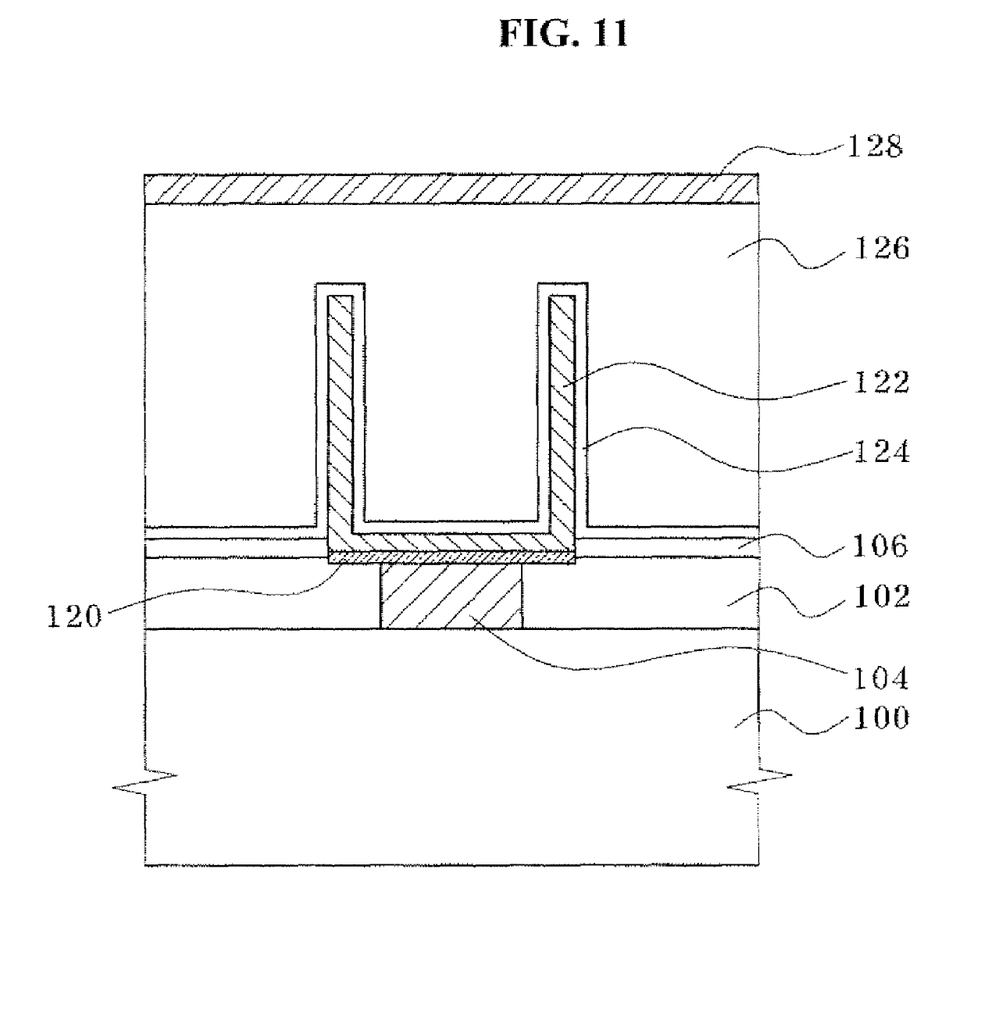

Referring to FIG. 11, a capping layer 128 is formed on the plate electrode 126. The capping layer 128 serves as a diffusion barrier which prevents oxygen (O$_2$) from diffusing during a subsequent process, for example the formation of an inter-metal dielectric layer (IMD) to insulate an upper wire from the capacitor. The capping layer 128 is made of a doped poly-silicon (poly-Si) or silicon germanium (SiGe). As mentioned above, the capping layer 128 is deposited while annealing with the hydrogen (H) atom-containing gas. The capping layer 128 prevents hydrogen (H) adsorbed on the surface of the titanium nitride layer reacts with oxygen (O) in air to form titanium oxynitride (TiON) upon the post-annealing vacuum break. The titanium oxynitride disadvantageously causes a deterioration in conductivity.

The method for forming a capacitor in a semiconductor device according to the invention comprises loading a semiconductor substrate in a furnace to deposit a capping layer on a plate electrode, introducing a hydrogen (H) atom-containing gas into the furnace, and inducing the reaction between the hydrogen and the chlorine (Cl) remaining on the plate electrode, thereby removing and discharging the chlorine (Cl).

When a dielectric layer material has a high dielectric constant (k), the dielectric layer undergoes excessive or abnormal crystallization upon a subsequent high-temperature process, due to a deteriorated thermal stability, thus causing an increase in leakage current. For this reason, when a dielectric layer is applied, a low-temperature annealing is performed for a titanium nitride (TiN) plate electrode. The low-temperature process results in the accumulation of a volatile by-product (i.e., chlorine (Cl)) in the layer during the deposition, thus deteriorating the device characteristics.

Accordingly, in the disclosed method, a semiconductor substrate is loaded into a furnace to deposit a capping layer on the plate electrode, a hydrogen (H) atom-containing gas is introduced into the furnace, and a reaction between the hydrogen (H) and the chlorine (Cl) remaining on the plate electrode is induced. As a result, the chlorine (Cl) is removed and discharged. The hydrogen (H) atom-containing gas, (e.g., $PH_3$ and/or $H_2$,) exhibits high reactivity even at a low temperatures of 400° C. to 600° C., when compared to ammonia ($NH_3$), nitrogen ($N_2$), and argon (Ar), which are conventionally utilized in annealing.

The reaction enables the by-product (e.g., Cl) remaining on the plate electrode to be removed and discharged efficiently at a low-temperature. As the content of chlorine (Cl) in the plate electrode lowers, the conductivity of the plate electrode improves. As a result, the work function of the plate electrode increases, and the energy band gap between the plate electrode and the dielectric layer increases. The increase in the energy band gap advantageously causes an increase in capacitance and a decrease in leakage current. In addition, the by-product present on the interface between the dielectric layer and the plate electrode is removed, and an electron trap site is thus removed. Accordingly, an improvement in interface characteristics, a decrease in leakage current, and an increase in dielectric breakdown voltage can be obtained.

The decrease in leakage current, the increase in dielectric breakdown voltage, and the increase in capacitance prevents a deterioration in capacitor characteristics due to a reduction in surface area caused by design rule reduction. With a limited area, the capacitor correspondingly has improved refresh properties and decreased margin failure, thereby improving the performance and yield of the device.

Although preferred embodiments of the invention have been disclosed for illustrative purposes, those skilled in the art will appreciate that various modifications, additions and substitutions are possible, without departing from the scope and spirit of the invention as defined in the accompanying claims.

For example, a method for removing a volatile by-product from a capacitor electrode of a DRAM device was disclosed in the embodiments. However, the method may be utilized in a variety of applications including gate electrodes of DRAM devices, flash devices, and SRAM electrodes.

As apparent from the foregoing, according to the method for forming a capacitor in a semiconductor device of the invention, the by-product generated upon forming the electrode of the capacitor can be removed by introducing a hydrogen (H) atom-containing gas onto the electrode, inducing the reaction between the hydrogen (H) and the chlorine (Cl) remaining on the electrode, and discharging the chlorine (Cl) to the outside.

The removal of impurities in the electrode improves the conductivity of the electrode, increases the work function thereof, increases the capacitance, and decreases the leakage current. In addition, the by-product present on the interface between the dielectric layer and the plate electrode is removed, thereby improving the interface characteristics, decreasing the leakage current, an increasing the dielectric breakdown voltage, and improving the performance of the device.

What is claimed is:

1. A method for forming a capacitor in a semiconductor device comprising:
    forming a storage node electrode over a semiconductor substrate;
    forming a dielectric layer having a high dielectric constant on the storage node electrode;
    depositing a plate electrode on the dielectric layer, thereby forming by-product impurities; and
    removing the by-product impurities remaining on the plate electrode by introducing a phosphine ($PH_3$) gas or hydrogen ($H_2$) gas onto the semiconductor substrate while depositing a capping layer on the plate electrode.

2. The method according to claim 1, wherein the plate electrode comprises a material selected from the group consisting of titanium nitride (TiN), ruthenium (Ru), tungsten nitride (WN), and aluminum nitride (AlN), and combinations thereof.

3. The method according to claim 1, wherein the dielectric layer comprises a material selected from the group consisting of hafnium oxide ($HfO_2$), alumina ($Al_2O_3$), zirconium oxide ($ZrO_2$), titanium oxide ($TiO_2$), tantalum oxide ($Ta_2O_5$), barium strontium titanate (BST; $BaSrTiO_3$), plumbum zirconate titanate (PZT; PbZrTiO), and combinations thereof.

4. The method according to claim 1, a high step coverage (HSC process, sequence flow deposition (SFD), or atomic layer deposition (ALD) to form the plate electrode.

5. The method according to claim 1, wherein removing the by-product impurities comprises:
    loading the semiconductor substrate into a furnace at a low pressure;
    introducing phosphine ($PH_3$) gas or hydrogen ($H_2$) gas into the furnace; and
    annealing the semiconductor substrate at a temperature of 400° C. to 600° C.

6. The method according to claim 1, wherein the capping layer comprises a polysilicon layer or a silicon germanium (SiGe) layer.

7. The method according to claim 1, comprising providing phosphine ($PH_3$) gas and hydrogen ($H_2$) gas separately or in combination.

8. The method according to claim 1, comprising introducing the hydrogen (H) atom-containing gas into the furnace in situ, thereby preventing a reaction between hydrogen (H) and oxygen (O) in air forming titanium oxynitride (TiON).

9. A method for forming a capacitor in a semiconductor device comprising:
    forming a storage node electrode over an interlayer dielectric layer of a semiconductor substrate;
    forming a dielectric layer having a high dielectric constant on the storage node electrode;
    supplying a titanium (Ti) source material and a nitride (N) source material to the dielectric layer to deposit a titanium nitride (TiN) layer on the dielectric layer thereby forming by-product impurities; and
    removing the by-product impurities remaining on the storage node electrode by introducing a phosphine ($PH_3$) gas or hydrogen ($H_2$) gas onto the semiconductor substrate while depositing a capping layer on the titanium nitride (TiN) layer.

10. The method according to claim 9, wherein the step of forming a storage node electrode on an interlayer dielectric layer comprises:
    forming a contact plug in the interlayer dielectric layer;
    forming a storage node insulating layer over the contact plug and the interlayer dielectric layer;
    forming a storage node contact hole in the storage node dielectric layer;
    forming a storage node metallic layer on the storage node contact hole;
    converting an interfacial region of the storage node metallic layer adjacent to the contact plug into a metal silicide layer; and
    node-separating the storage node metallic layer, thereby forming the storage node electrode.

11. The method according to claim 9, wherein the storage node electrode comprises a material selected from the group consisting of titanium nitride (TiN), ruthenium (Ru), tungsten nitride (WN), aluminum nitride (AlN), and combinations thereof.

12. The method according to claim 9, wherein the titanium (Ti) source material comprises titanium tetrachloride (TiCl$_4$).

13. The method according to claim 9, wherein the dielectric layer comprises a material selected from the group consisting of hafnium oxide (HfO$_2$), alumina (Al$_2$O$_3$), zirconium oxide (ZrO$_2$), titanium oxide (TiO$_2$), tantalum oxide (Ta$_2$O$_5$), barium strontium titanate (BST; BaSrTiO$_3$), plumbum zirconate titanate (PZT; PbZrTiO), and combinations thereof.

14. The method according to claim 9, comprising performing a high step coverage (HSC) process, sequence flow deposition (SFD), or atomic layer deposition (ALD) to form the storage node electrode.

15. The method according to claim 9, wherein the step of removing the by-product impurities comprises:
    loading the semiconductor substrate into a furnace at a low pressure;
    introducing phosphine (PH$_3$) gas or hydrogen (H$_2$) gas into the furnace; and
    annealing the semiconductor substrate at a temperature of 400° C. to 600° C.

16. The method according to claim 9, wherein the capping layer comprises a polysilicon layer or a silicon germanium (SiGe) layer.

17. The method according to claim 15, comprising providing phosphine (PH$_3$) gas and hydrogen (H$_2$) separately or in combination.

18. The method according to claim 9, comprising introducing the hydrogen (H) atom-containing gas into the furnace in situ, thereby preventing a reaction between hydrogen (H) and oxygen (O) in air forming titanium oxynitride (TiON).

19. The method according to claim 1, wherein removing the by-product impurities comprises:
    loading the semiconductor substrate into a furnace at a low pressure;
    introducing the phosphine (PH$_3$) gas or the hydrogen (H$_2$) gas into the furnace; and
    annealing the semiconductor substrate at a temperature of 400° C. to 489° C.

20. The method according to claim 9, wherein removing the by-product impurities comprises:
    loading the semiconductor substrate into a furnace at a low pressure;
    introducing the phosphine (PH$_3$) gas or the hydrogen (H$_2$) gas into the furnace; and
    annealing the semiconductor substrate at a temperature of 400° C. to 489° C.

* * * * *